United States Patent [19]
Wada et al.

[11] Patent Number: 5,445,847
[45] Date of Patent: Aug. 29, 1995

[54] METHOD FOR PREPARING CHALCOPYRITE-TYPE COMPOUND

[75] Inventors: Takahiro Wada, Katano; Mikihiko Nishitani, Nara; Takayuki Negami, Katano, all of Japan

[73] Assignee: Matsushita Electric Industrial Co., Ltd., Kadoma, Japan

[21] Appl. No.: 249,999

[22] Filed: May 27, 1994

Related U.S. Application Data

[63] Continuation of Ser. No. 61,708, May 17, 1993, abandoned.

Foreign Application Priority Data

May 19, 1992 [JP] Japan .................................. 4-125848

[51] Int. Cl.$^6$ .............................................. B05D 1/36
[52] U.S. Cl. ........................................ 427/74; 427/76; 427/248.1; 427/255.2; 423/508; 423/511
[58] Field of Search ............ 427/74, 76, 248.1, 255.2; 423/508, 511

[56] References Cited

U.S. PATENT DOCUMENTS

| | | | |
|---|---|---|---|
| 4,335,266 | 6/1982 | Mickelsen et al. | 427/255.2 |
| 4,392,451 | 7/1983 | Mickelsen et al. | 118/690 |
| 4,465,575 | 8/1984 | Love et al. | 427/76 |
| 4,684,761 | 8/1987 | Devaney | 427/76 |
| 4,915,745 | 4/1990 | Pollock et al. | 427/76 |
| 5,015,503 | 5/1991 | Varrin, Jr. et al. | 427/255.2 |
| 5,028,274 | 7/1991 | Basol et al. | 427/76 |

FOREIGN PATENT DOCUMENTS 0318315 5/1989 European Pat. Off.

OTHER PUBLICATIONS

CRC Handbook of Chemistry and Physics, p. B-3, 1969-1970.

A. Rockett et al, "CuInSe2 for Photovoltaic applications", Journal of Applied Physics, Oct. 1991, pp. 81-97.

S. Moorthy Babu et al, "Thin Film Deposition and Characterization of CuInSe2", Thin Solid Films, Mar. 1991, pp. 268-270.

Y. Ueno et al, "Synthesis and Photoelectrochemical Characterization of . . . ", Solar Energy Materials and Solar Cells, Apr. 1992, pp. 229-242.

Basol et al, "Deposition of CuInSe2, Films by a Two-Stage Process Utilizing E-Beam Evaporation", IEEE Transactions on Electron Devices, vol. 37, No. 2, Feb. 1990, pp. 418-421.

Knowles et al, "Thin films of CuInSe2 Produced by a Solid State Reaction from Stacked Elemental Layers", Semicond. Sci. Technol. 3, (1988), pp. 1143-1144.

A. Rockett and R. W. Birkmire; "CuInSe2 for photovoltaic applications"; J. Appln. Phys. 70 (7), 1 Oct. 1991; pp. R81 . . . pp. R97.

Primary Examiner—Shrive Beck
Assistant Examiner—Brian K. Talbot
Attorney, Agent, or Firm—Cushman, Darby & Cushman

[57] ABSTRACT

A chalcopyrite-type compound, for instance, $CuInS_2$ or $CuGaS_2$, is prepared by subjecting a Group I–III oxide composition, containing at least one of the Group Ib element, for instance copper (Cu), and at least one of the Group IIIb element, for instance indium (In) or gallium (Ga) to a heat treatment under a reducing atmosphere containing the Group VIb element, for instance sulfur (S) or selenium (Se), or under an atmosphere containing a reducing compound of the Group VIb element, thereby converting said oxide composition into a chalcopyrite-type compound.

17 Claims, 9 Drawing Sheets

METHOD FOR PREPARING CHALCOPYRITE-TYPE COMPOUND

This is a continuation of application Ser. No. 08/061,708, filed on May 17, 1993, now abandoned.

FIELD OF THE INVENTION AND THE RELATED ART STATEMENT

1. FIELD OF INVENTION

The present invention generally relates to the production of a chalcopyrite-type compound. In particular, it is concerned with a method for preparing the chalcopyrite-type compound formed in a thin film for use in a thin film-type solar cell having a high energy conversion efficiency.

2. DESCRIPTION OF THE PRIOR ART

The thin film of the chalcopyrite-type compound for use in an absorber layer of the solar cell has hitherto been prepared in a two step process as shown by FIG. 8. In the shown conventional process, an electrode 12 of molybdenum (Mo) or the like is first deposited on a substrate 11, and then a copper (Cu) thin film 13 and an indium (In) thin film 14 are laminated on the electrode 12 in a manner that the ratio of the film thickness of the copper thin film 13 to that of the indium thin film 14 is in approximately 1:2.2–2.4. The laminated substrate 11 is then treated under a chalcogen atmosphere including, for instance, selenium (Se) or sulfur (S), or under chalcogen-containing gas, for instance, $H_2Se$ or $H_2S$, with heat, to obtain a thin film of $CuInSe_2$ or $CuInS_2$ as the thin film 15 of chalcopyrite-type compound.

Alternatively, the chalcopyrite-type thin film has been obtained by a solid phase reaction process as shown by FIG. 9, which is similar to that which is shown in FIG. 8. In this process, after laminating the Cu thin film 13 and the In thin film 14 on the electrode 12 of the substrate 11, a chalcogen thin film 16 of, for instance, sulfur (S), selenium (Se), tellurium (Te) or the like, is further vapor-deposited on the laminated thin films of Cu and In. Then, the vapor-deposited substrate is treated with heat, to obtain a thin film of $CuInSe_2$ or $CuInS_2$ as the thin film 17 of the chalcopyrite-type compound in a solid phase reaction.

In the above-mentioned prior art production methods, wherein the two layers of the thin film of the Group Ib element and that of the Group IIIb element are treated with heat under the presence of the chalcogen to obtain a chalcopyrite-type compound, there is such a problem that a deviation is observed in a composition ratio of the Group Ib element to the Group IIIb element in the obtained compound, and that the composition itself is not always microscopically constant.

Since the electric characteristics of the chalcopyrite-type compound are largely dependent on the composition thereof, the above-mentioned deviation of composition and microscopic heterogeneity of composition are sometimes the factors for deteriorating the electric characteristics of the chalcopyrite-type compound. In particular, this tendency of deteriorating the electric characteristics due to the composition deviation in the chalcopyrite-type compound is especially remarkable in, for instance, the solar cell which is fabricated by laminating the thin films. In the prior art production methods of the chalcopyrite-type compounds, strict control on the composition has however been difficult.

Namely, the melting points of the Group IIIb elements are low. Therefore, when the laminated thin films of the Group Ib element and the Group IIIb element are treated under a chalcogen atmosphere including, for instance, selenium (Se) or sulfur (S), or in chalcogen-containing gas, for instance, $H_2Se$, $CS_2$ or $H_2S$, with heat, the film of the Group IIIb element is first molten. Since the molten Group IIIb element aggregates to form a great number of liquid drops, the distribution state of the Group IIIb element, which should be uniformly existed throughout the thin film, is brought to be heterogeneous. Therefore, the microscopic composition of the thin film of the chalcopyrite-type compound, which is obtained by the heat treatment of the Group IIIb element and the Group Ib element in the presence of the chalcogen, is heterogeneous.

In addition, the variation in the composition of the thin film produced by the prior art method is caused particularly by the state of the In thin film 14. Namely, when the In thin film 14 is formed by means of the vapor deposition method, an unevenness as indicated by S in FIGS. 8(a) and 9(a) can not be eliminated. Therefore, there is such another problem in the prior art production method that, owing to the microscopic heterogeneity of In, a microscopic variation is caused in the composition in the obtained thin film of the chalcopyrite-type compound.

OBJECT AND SUMMARY OF THE INVENTION

It is therefore the primary object of the present invention to provide a method for preparing the chalcopyrite-type compound that is immune from the deviation in the composition and from the microscopic variation in the composition.

According to the present invention, there is provided a method for preparing a chalcopyrite-type compound, which comprises: treating a Group I–III oxide composition, containing at least one of the Group Ib element and at least one of the Group IIIb element, with heat under a reducing atmosphere containing at least one of the Group VIb element or under an atmosphere containing a reducing compound of at least one of the Group VIb element, thereby converting said oxide composition into a chalcopyrite-type compound.

The preparing method of the present invention resides in a process. Therein after the Group I–III oxide composition has previously been prepared, the oxygen atoms contained in the oxide composition are removed in the reducing atmosphere and the oxygen atoms are simultaneously substituted by the atoms of the Group VIb element to synthesize the chalcopyrite-type compound.

The Group I–III oxide composition defined in the present invention may be any of a mixture of at least one of the oxide of the Group Ib element and at least one of the oxide of the Group IIIb element, a complex oxide of at least one of the Group Ib element and at least one of the Group IIIb element, any other composition containing at least one of the Group Ib element, at least one of the Group IIIb element and oxygen, or any material containing at least one of the Group Ib element, at least one of the Group IIIb element and oxygen, regardless of its state, i.e., crystalline or amorphous.

The present inventors have confirmed that the main cause of the difficulty in the composition control and the microscopic variation in the composition of the chalcopyrite-type compound obtained in the prior art production method resides in the low melting point of the Group IIIb element, for instance In or Ga, which constitutes the thin film to be reacted with the chalcogen. In contrast to this, the melting point of any of said oxide composition is sufficiently high. For instance, the melting point of $In_2O_3$ is 1910° C., which is much higher than the melting point of In of 157° C., and the melting point of $Ga_2O_3$ is 1795° C., which is much higher than the melting point of Ga of 30° C. Further, the melting point of the complex oxide of the Group Ib element and the Group IIIb element, for instance $Cu_2In_2O_5$ or $CuGaO_2$ is above 1000° C. Thus, either of the melting point of the oxide of the Group IIIb element or the melting point of the complex oxide of the Group Ib element and the Group IIIb element is much higher than the melting point of the Group IIIb element or simple substance.

Based on this fact, the Group I–III oxide composition does not melt down at the heat treatment temperature under the reducing atmosphere containing the Group VIb element or under the atmosphere including the reducing compound of the Group VIb element; and thus its initial composition can be maintained. In this manner, the chalcopyrite-type compound having a microscopically uniform composition can be synthesized in accordance with the present invention.

Thus, the Group I–III oxide composition used in the method of the present invention can form a uniform thin film which will be described later, regardless of its structure. Therefore, the microscopic variance in the composition caused by the unevenness of the surface of the prior art thin film of, for instance In, is successfully eliminated.

As above-mentioned, the oxide composition of the present invention includes; a mixture of the oxide of the Group Ib element and the oxide of the Group IIIb element; a complex oxide of the Group Ib element and the Group IIIb element; any composition containing the Group Ib element, the Group IIIb element and the oxygen; and any substance containing the Group Ib element, the Group IIIb element and the oxygen; regardless of its structure. In order to obtain the chalcopyrite-type compound in a thin film state, it is preferable to use a complex oxide of the Group Ib element and the Group IIIb element as the Group I–III oxide composition. In addition to this, it is desirable for the Group I–III oxide composition to be in an amorphous state, because the heat treatment can be performed at a very low temperature, say, 250° C., for converting the oxide composition into the chalcopyrite-type compound under the reducing atmosphere including the Group VIb element or under the atmosphere containing the reducing compound of the Group VIb element. In the present invention, the oxide composition in the amorphous state includes such one that (i) the whole body of the oxide composition is in the amorphous state, and (ii) another one that either one of the oxide of the Group Ib element or the oxide of the Group IIIb element is in the amorphous state and the other is in the crystalline state. In addition to this, even in such case that the oxide composition is the amorphous state, it is desirable to perform the heat treatment at a high temperature, for instance about 400° C., in order to surely make the chalcopyritization, or to cope with such as film thickness of the Group I–III oxide composition.

Namely, the preferable temperature of the heat treatment on the oxide composition, under the reducing atmosphere including the Group VIb element or under the atmosphere containing the reducing compound of the Group VIb element, lies in the range of 250°–700° C. and more preferably in the range of 400°–600° C.

The upper limit imposed on the heat treatment temperature is determined by the melting point of the chalcopyrite-type compound to be synthesized. Incidentally, the melting point of $CuInS_2$ or $CuInSe_2$ is 900° C. or above. Therefore, in the case of preparing the thin film of the chalcopyrite-type compound in the process of the present invention, the upper limit of the heat treatment is then normally determined by the heat-resisting property of the substrate used. In case of using a soda-lime glass as the substrate, it is desirable to use the heat treatment temperature under 600° C., and in case of a boro-silicate glass, it is desirable to use the heat treatment temperature under 700° C.

It is appropriate to vary the time for the heat treatment in compliance with the particle size of the Group I–III oxide composition to be treated and the thickness of the thin film to be treated as well as the heat treatment temperature. In a case, where the thickness of the oxide composition film is small and the heat treatment temperature is high, the required chemical reaction proceeds satisfactorily during the heat treatment in a short time, and the intended chalcopyrite-type compound is obtained. In contrary to this, in a case, where the thickness of the oxide composition film is large and the heat treatment temperature is low, a long heat treatment time is required.

Although the Group Ib element which can be applicable to the present invention is, for instance, Cu or Ag, it is preferable to use Cu for the application to the solar cell device, because it produces a chalcopyrite-type compound having a band gap suitable for absorbing the solar light ray.

The Group IIIb element which can be applicable to the present invention is, for instance, Al, Ga, In or Tl. It is however preferable to use Ga and/or In for the application to the solar cell device, because it produces a chalcopyrite-type compound having a band gap suitable for absorbing the solar light ray.

The Group VIb element which can be applicable to the present invention is so-called chalcogen such as S or Se. Further, as the reducing compound of the Group VIb element which can be applicable to the present invention, for instance $H_2S$, $CS_2$, $H_2Se$, $(CH_3)_2Se$, $(C_2H_5)_2Se$ and the like may be exemplified. It is however preferable to use $H_2S$, $CS_2$, or $H_2Se$ for their easy handling. In addition, the Group VIb element or the reducing compound of the Group VIb element applicable to the present invention may be of a single species or a plurality of species and may suitably be selected in compliance with the preparing conditions.

Further, the reducing atmosphere including the Group VIb element or the atmosphere containing the reducing compound of the Group VIb element may be in any state of; for instance, a mixed atmosphere containing a vapor of the Group VIb element such as S or Se and a reducing gas such as $H_2$; a mixed atmosphere containing a vapor of the Group VIb element such as S, a reducing gas such as $H_2$ and/or a reducing compound of the Group VIb element such as $H_2S$; or an atmosphere of the reducing compound of the Group VIb element such as $H_2S$.

In a case, wherein the atmosphere is constituted only with the Group VIb element however, a reducing atmosphere, for instance $H_2$, CO or the like is required to be prepared simultaneously. The reducing atmosphere defined in the present invention is an environment surrounding at least the oxide composition itself, and may be a means for embedding the oxide composition in powder satisfying the required condition. However, the above-described manner of preparing the atmosphere by vaporizing the above-defined element or compound is generally applicable and is preferred in view point of the manufacturing.

In the following paragraphs, an illustration will be made on a method for preparing the oxide composition, which can be converted into the chalcopyrite-type compound by the heat treatment under the reducing atmosphere including the Group VIb element, or under the atmosphere containing the reducing compound of the Group VIb element.

The Group I-III oxide composition defined in the present invention may be a mixture of the oxide of the Group Ib element with the oxide of the Group IIIb element. Besides, a composition of the type Ib-IIIb-O or a complex oxide of the Group Ib element and the Group IIIb element, which can be obtained by sintering the mixture of said oxides, is also preferably applied.

All of these, in their powder state, can be converted into the chalcopyrite-type compound, by the heat treatment under the reducing atmosphere including the Group VIb element or under the atmosphere containing the reducing compound of the Group VIb element. The following description is primarily centered around a method for preparing the thin film of the mixture of the oxides, and of the Ib-IIIb-O type composition or the complex oxide of the Group Ib element and the Group IIIb element, each being to be converted into the thin film of the chalcopyrite-type compound. As the method for obtaining the thin film, any method known to those skilled in the art as the thin film technology can be employed. It is to be noted that the method enumerated below is only exemplary and any other method can also be applicable to the present invention.

(1) A method of preparing the thin film of said oxide composition or complex oxide on a substrate in a physical vapor deposition (PVD) method such as laser ablation or sputtering by employing a target of the Ib-IIIb-O type composition or the complex oxide. The target may be obtained by, for instance, sintering a mixture of the oxide of the Group Ib element and the oxide of the Group IIIb element.

(2) A method of preparing the thin film of said Ib-IIIb-O type composition or complex oxide on a substrate, wherein a paste containing the powder of said Ib-IIIb-O type composition or the complex oxide is deposited on the substrate by a printing technology such as a screen process printing.

(3) A method of preparing the thin film of said Ib-IIIb-O type composition or the complex oxide containing the Group Ib element and the Group IIIb element deposited on the substrate by PVD method employing separate targets of the oxide of the Group Ib element and the oxide of the Group IIIb element.

(4) A method of preparing the thin film of the mixture of the oxide of the Group Ib element and the oxide of the Group IIIb element on a substrate, wherein a paste containing the powder of said oxides is deposited on the substrate by a printing technology.

In the above-described methods, it is suitable to select the thickness of the thin film prepared by the thin film technology such as PVD method to be smaller than 10 $\mu$m and it is preferable to select the thickness to be smaller than 5 $\mu$m.

Further, it is suitable to select the thickness of the thin film prepared by the printing technology to be larger than 5 $\mu$m and it is preferable to select the thickness to be larger than 10 $\mu$m. And it is suitable to select the particle size of the powder for preparing the paste for the printing to be smaller than 3 $\mu$m and it is preferable to select the particle size to be smaller than 1 $\mu$m.

In the following paragraphs, concrete conditions under which the method of the present invention is performed will be described.

Incidentally, it is desirable, for such a case of employing the thin film of the chalcopyrite-type compound prepared by the method of the present invention in a solar cell or the like, to perform an elimination of by-products after the synthesis of the chalcopyrite-type compound. The reason is that, in the method for preparing the chalcopyrite-type compound of the present invention, the by-product of the oxygen-containing compound such as $H_2O$ or $CO_2$ is produced during the substitution of the oxygen atom contained in the oxide composition including the Group Ib element and the Group IIIb element by the Group VIb element. Normally, these compounds are removed from the reaction system in a form of gas. However, the $H_2O$ or $CO_2$ is sometimes liable to be adsorbed on the thin film or otherwise trapped therein. In addition to this, the $H_2O$ or $CO_2$ may sometimes imposes an detrimental influence on the performance of the solar cell device, when the n-type window layer is formed on the thin film to prepare the solar cell device.

Therefore, in the preparing method of the present invention, it is desirable to eliminate the by-product from the sample after the synthesis of the chalcopyrite-type compound as soon as possible. One of the method for the elimination is a heat treatment of the chalcopyrite-type compound in a dried inert gas such as $N_2$ or Ar which does not react with the synthesized chalcopyrite-type compound, or under a reduced pressure. It is desirable to employ a heating temperature of 80° C. or above. The condition has been found by performing thermogravimetry (TG) and mass spectrometry (MS) on the powder of $CuInS_2$ synthesized by the manufacturing method of the present invention under various atmospheres.

As above-stated, the present invention has an advantage in that a uniform chalcopyrite-type compound can be produced which is immune from the deviation in the composition and the macroscopic deviation in the composition which had been the problems in the prior art technology, and thus a uniform thin film suitable for the manufacturing the devices such as solar cell can be prepared.

While the novel features of the present invention are set fourth particularly in the appended claims, the invention, both as to organization and content, will be better understood and appreciated, along with other objects and features thereof, from the following detailed description taken in conjunction with the appended drawings.

BRIEF DESCRIPTION OF THE DRAWINGS

FIGS. 1(*a*) and 1(*b*) are schematic views for illustrating the method for preparing the chalcopyrite-type compound in accordance with the present invention, wherein;

(a) shows a step of laminating the oxide composition layer, and (b) shows a step of synthesizing the chalcopyrite-type compound.

Figure 2:
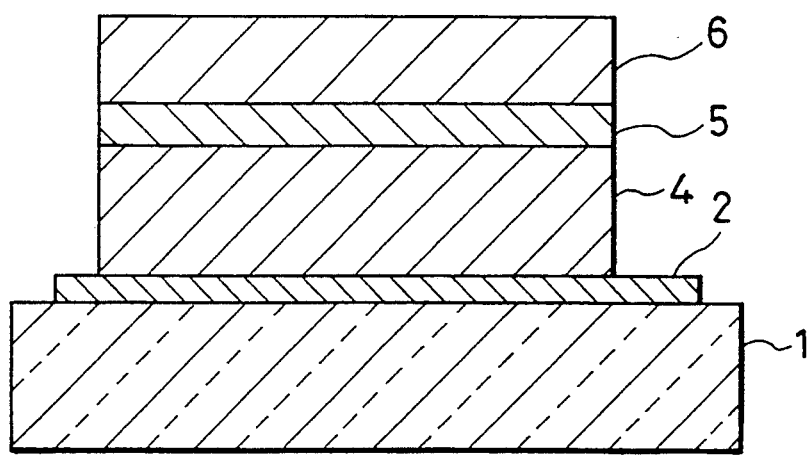

FIG. 2 is a schematic cross-sectional side view for illustrating an example of the solar cell which uses the thin film of the chalcopyrite-type compound obtained in accordance with the method of the present invention.

Figure 3:
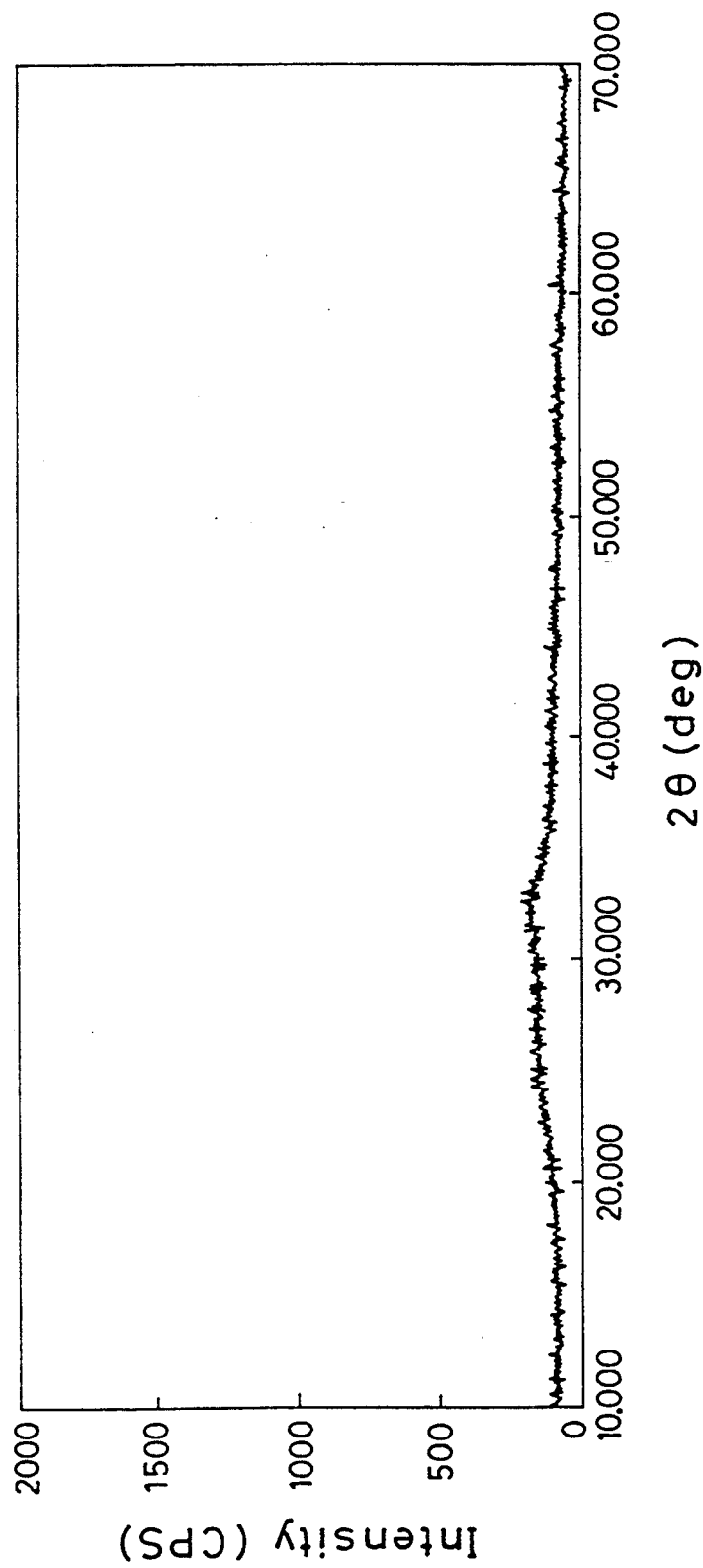

FIG. 3 is an X-ray diffraction pattern of the oxide thin film (Cu—In—O) obtained in accordance with the method in Example 1 of the present invention.

Figure 4:
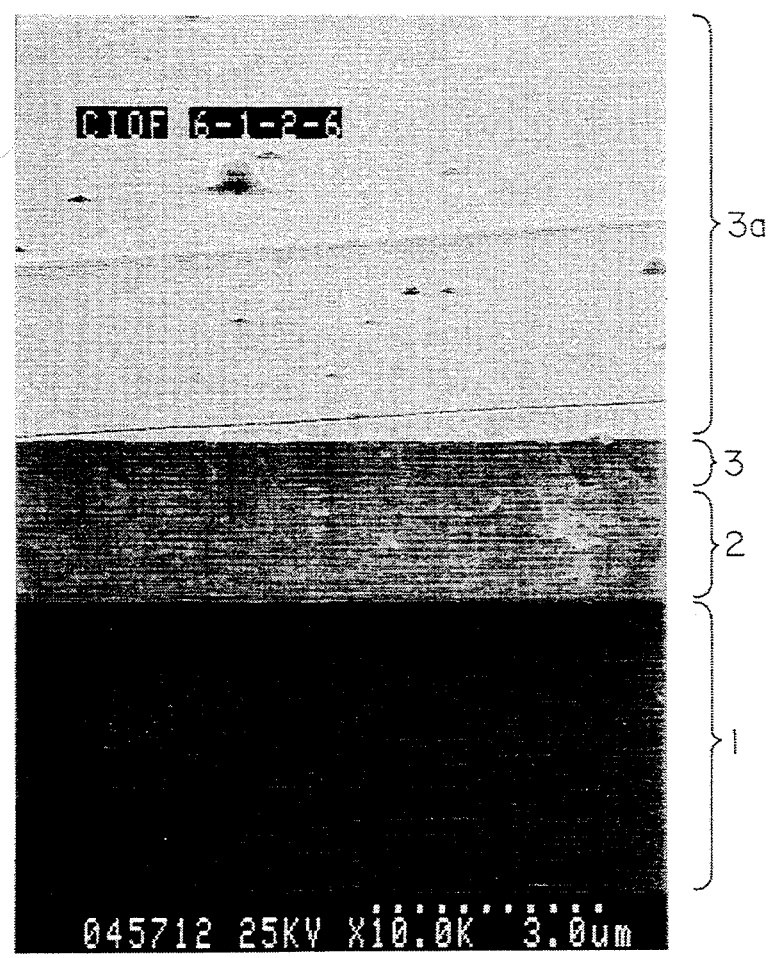

FIG. 4 is a scanning electron microscopic photograph of the oxide thin film (Cu—In—O) obtained in accordance with the method in Example 1 of the present invention.

Figure 5:
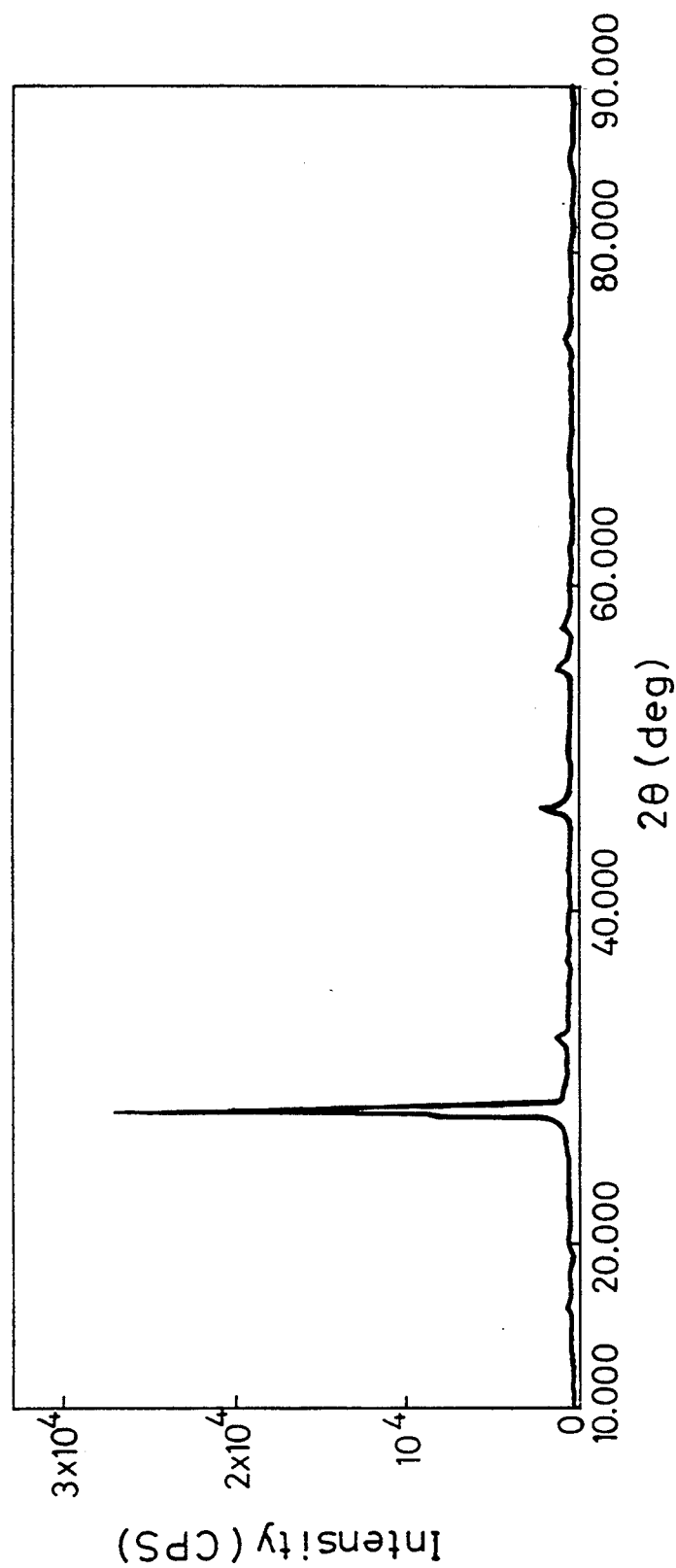

FIG. 5 is an X-ray diffraction pattern of the chalcopyrite-type compound ($CuInS_2$) obtained in accordance with the method in Example 1 of the present invention.

Figure 6:
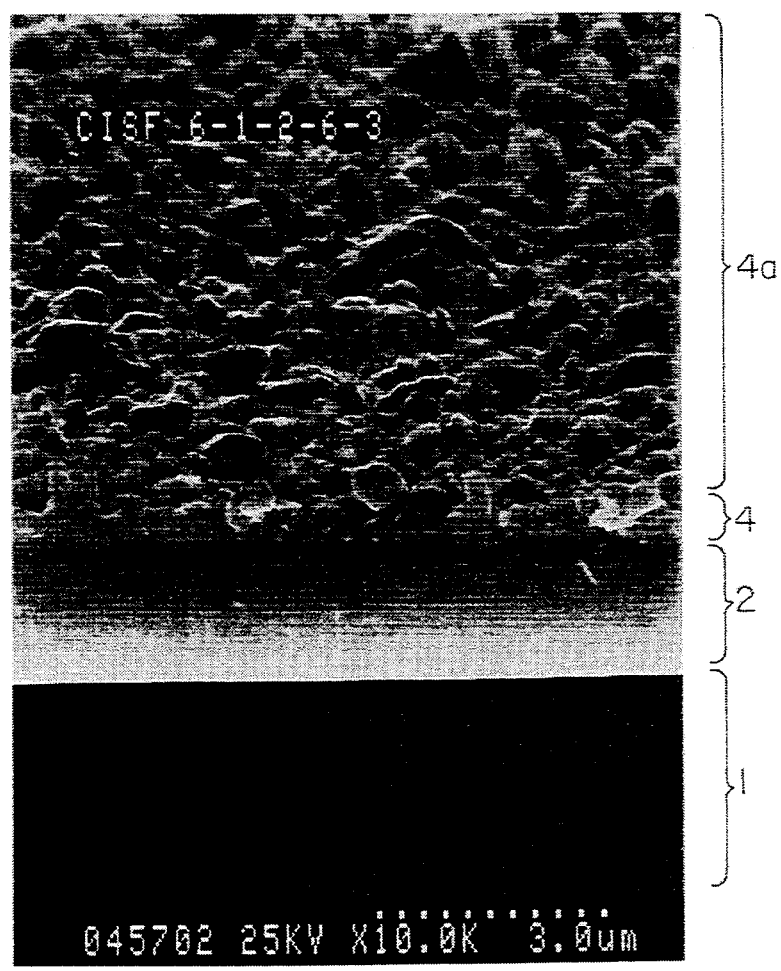

FIG. 6 is a scanning electron microscopic photograph of the chalcopyrite-type compound ($CuInS_2$) obtained in accordance with the method in Example 1 of the present invention.

Figure 7:
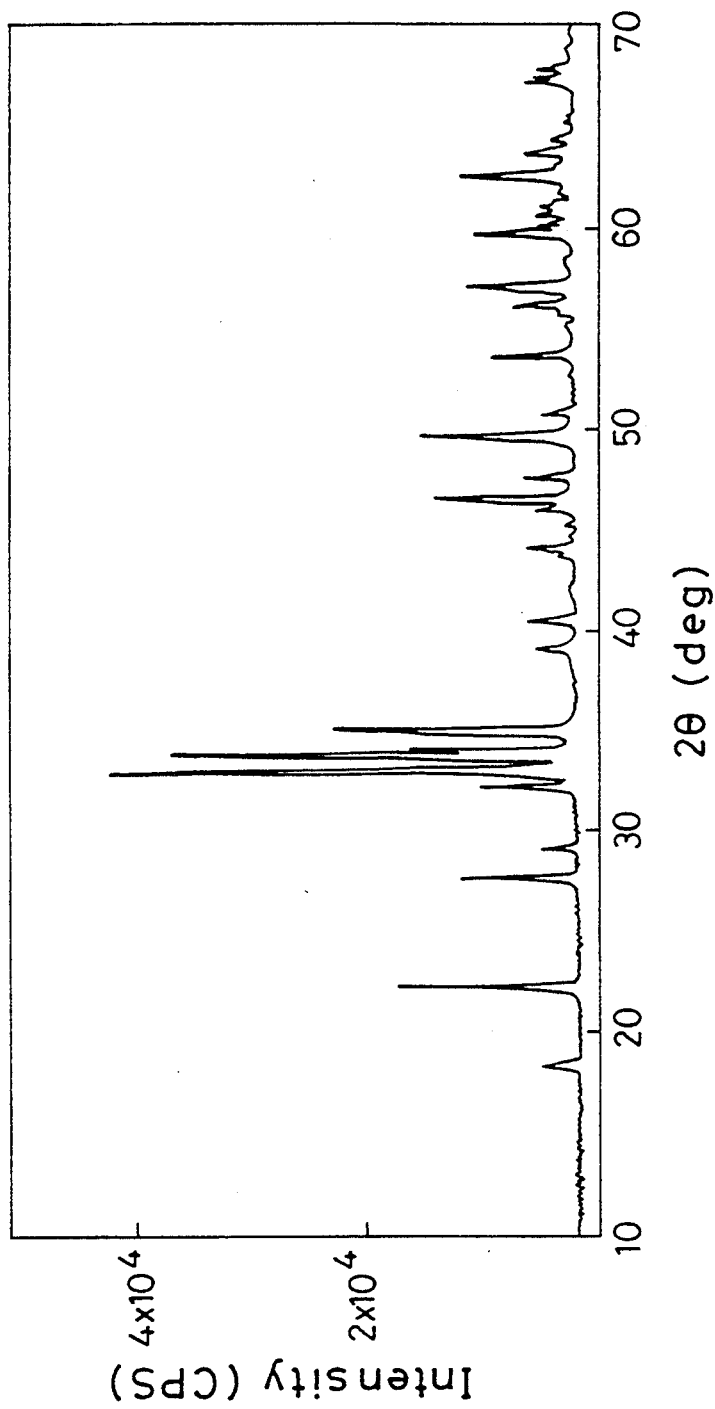

FIG. 7 is an X-ray powder diffraction pattern of the oxide ($Cu_2In_2O_5$) used in Example 7 of the present invention.

Figure 8A:
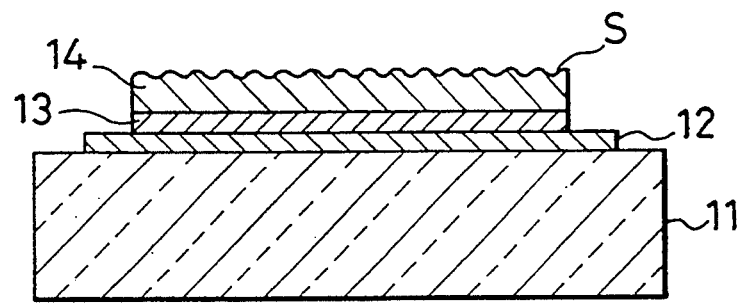
Figure 8B:
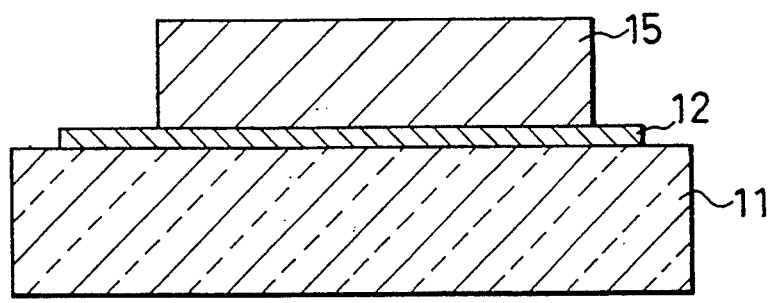

FIG. 8(a) and (b) are schematic views for illustrating the prior art method for preparing a thin film of the chalcopyrite-type compound, wherein;

(a) shows a step of laminating the metal layers, and, (b) shows a step of synthesizing the chalcopyrite-type compound.

Figure 9A:
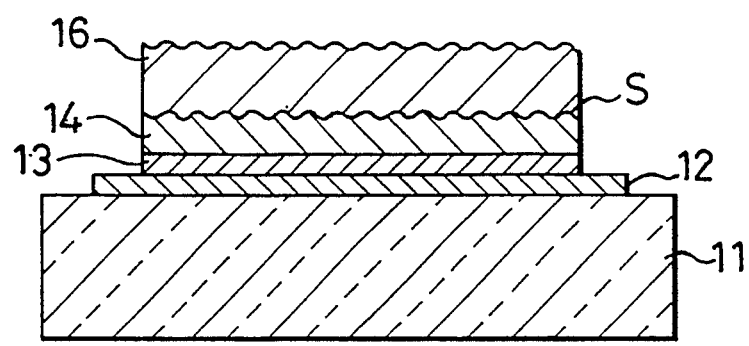
Figure 9B:
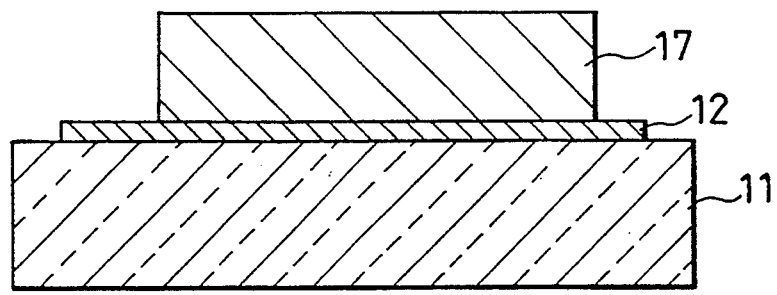

FIGS. 9(a) and (b) are schematic views for illustrating the other prior art method for preparing a thin film of the chalcopyrite-type compound, wherein;

(a) shows a step of laminating the layers of the metals and of the chalcogen, and, (b) shows a step of synthesizing the chalcopyrite-type compound.

It will be recognized that some or all of the Figures are schematic representations for purposes of illustration and do not necessarily depict the actual relative sizes or locations of the element shown.

DETAILED DESCRIPTION OF THE PREFERRED EMBODIMENTS

In the following paragraphs, the present invention will be described in more detail by way of example with reference to the attached drawings.

Figure 1A:
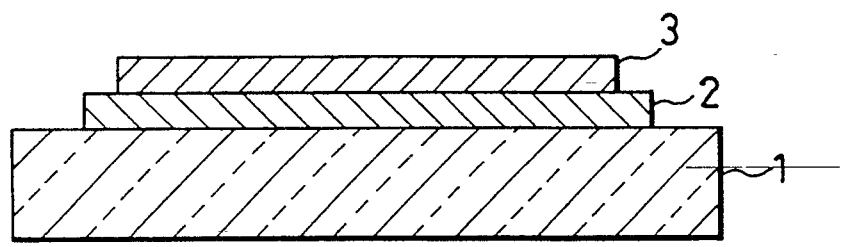
Figure 1B:
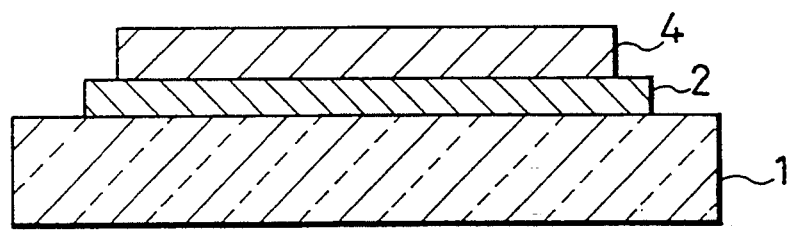

FIG. 1 illustrates the steps for obtaining the thin film of the chalcopyrite-type compound in accordance with the present invention. In FIG. 1, a thin film 2 of molybdenum or the like is deposited on a substrate 1 of a glass or the like. In this embodiment of the present invention, a thin film 8 of the Group I-III oxide composition is first laminated on the film 2 in a method as described above (FIG. 1(a)). Next, said thin film 3 is converted into a thin film 4 of the chalcopyrite-type compound by subjecting the laminated substrate to a heat treatment under a reducing atmosphere including the Group VIb element or under an atmosphere containing the reducing compound of the Group VIb element (FIG. 1(b)).

One typical example of the solar cell device fabricated by employing, as its light absorber layer, the thin film 4 of the chalcopyrite-type compound obtained as described in the above is illustrated by FIG. 2. As shown in FIG. 2, an n-type window layer 5 and a transparent electrode 6 are laminated on said thin film 4, in turn. In general, cadmium sulfide (CdS) is used as the n-type window layer 5 and zinc oxide (ZnO) is used as the transparent electrode 6.

EXAMPLE 1

Powder of CuO (particle size: 3 μm or under) of the purity: 99.9 % or above and powder of $In_2O_3$ (particle size: 3 μm or under) of the purity: 99.9 % or above are weighed in a manner that a molar ratio of 2:1 is obtained, and mixed in a ball mill with balls (diameter: 5 mm) of zirconia and water for 20 hours.

The obtained mixed powder is calcined in a dried air at 950° C. for 10 hours, pulverized and granulated. The granulated powder is press-molded and the molded body is baked in the air at 1000° C. for 10 hours to obtain a target of a sintered body. The phase of the sintered target is analyzed by X-ray diffraction to be $Cu_2In_2O_5$.

An oxide thin film (Cu—In—O) of a thickness of about 0.5 μm is deposited on a molybdenum (Mo)-coated glass substrate by applying laser ablation using an excimer laser of XeCl to the above sintered target. The molybdenum layer has previously deposited on the glass substrate in a thickness of about 1 μm by an electron beam deposition method. During the laser ablation process, the temperature of the substrate is maintained to the room temperature.

ICP emission spectroscopy performed on the obtained thin film reveals that composition of the sintered body is maintained as it is, and thus molar ratio of Cu: In equals to 1:1. X-ray diffraction on the obtained thin film produces no distinct diffraction peak and thus it is found that the thin film is amorphous.

A scanning electron microscopic (SEM) photograph of the oxide thin film is shown by FIG. 4. This photograph is taken by inclining the thin film to its cross-section by 10°. In FIG. 4, reference numerals 1, 2 and 3 indicate the glass substrate, the molybdenum layer and the oxide layer, respectively. The parts 1–3 represent the respective cross-sections while the part 3a represents the surface of the oxide layer. From FIG. 4, it is found that the surface condition of the obtained oxide thin film is exceptionally uniform.

The oxide thin film is then subjected to a heat treatment under a $H_2S$ atmosphere (5% of $H_2S$ + 95% of $N_2$) at 400° C. for 4 hours. An X-ray diffraction pattern on the obtained thin film of the chalcopyrite-type compound (Cu—In—S) is shown in FIG. 5. Based on this X-ray diffraction pattern, it is found that the thin film of Cu—In—S is a single phase $CuInS_2$.

ICP emission spectroscopy on the obtained thin film confirmed that molar ratio of Cu:In:S equals to 1:1:2. An investigation on two dimensional distribution of respective elements in the thin film by using an X-ray microanalyzer revealed that there is no maldistribution of Cu, In or S in the thin film and found that composition is microscopically uniform.

A scanning electron microscopic photograph of the thin film of the chalcopyrite-type compound prepared in the process of this Example is shown by FIG. 6. Similar to FIG. 4, the photograph of FIG. 6 is taken by inclining the thin film to its cross-section by 10°. In FIG. 6, reference numerals 1, 2 and 4 indicate the glass substrate, the molybdenum layer and the chalcopyrite-type compound layer, respectively. The parts 1, 2 and 4 represent the respective cross-sections while the part 4a represents the surface of the chalcopyrite-type compound layer. From this scanning electron microscopic photograph, it is confirmed that, in the thin film of the chalcopyrite-type compound prepared in the process of this Example, crystal grain sizes are exceptionally uniform, and thus crystal grains are sufficiently grown.

Further, it is found that the thin film of the chalcopyrite-type compound has a sufficient adhesivity with the molybdenum which had previously been raised as an unsolved problem in the prior art.

EXAMPLE 2

As in Example 1, a molybdenum layer has previously deposite on a glass substrate, on which a thin film of the chalcopyrite-type compound is to be formed, in a thickness of about 1 μm by an electron beam deposition method. First, as the oxide thin film, a Cu—In—O thin film is deposited on the molybdenum (Mo) film on the substrate maintained at 300° C., by magnetron sputtering of a similar sintered target of $Cu_2In_2O_5$, as that has been used in Example 1.

ICP emission spectroscopy on the obtained oxide thin film reveals that composition of the sintered target is maintained as it is, and thus molar ratio of Cu:In equals to 1:1. By X-ray diffraction on the obtained oxide thin film, only distinct diffraction peak of $In_2O_3$ is observed. This result of the observation shows that said thin film is a mixture of an amorphous Cu—In—O or Cu—O and a crystalline $In_2O_3$.

The oxide thin film is then subjected to a heat treatment under a $H_2S$ atmosphere similar to that used in Example 1, at 500° C. for 2 hours. The thus obtained thin film of Cu—In—S is analyzed by X-ray diffraction. As a result, it is found that the thin film is a chalcopyrite-type compound of a single phase $CuInS_2$ having a crystal structure of the chalcopyrite-type.

ICP emission spectroscopy on the obtained chalcopyrite-type compound confirmed that molar ratio of Cu:In:S equals to 1:1:2. An investigation on two dimensional distribution of respective elements in the Cu—In—S thin film using an X-ray micro-analyzer confirmed that its composition was microscopically uniform. Based on an observation through a scanning electron microscope, it was also confirmed that composition of the chalcopyrite-type compound prepared in this Example was exceptionally uniform and thus crystal grains were sufficiently grown.

Further, it is found that the thin film of the chalcopyrite-type compound has a sufficient adhesivity with the molybdenum which had previously been raised as an unsolved problem in the prior art.

EXAMPLE 8

Two kinds of sintered targets, containing Cu and In in molar ratios of 1.1:0.9 and 0.9:1.1, are prepared in the same manner as employed in Example 1 by using the starting materials of CuO and $In_2O_3$ similar to those in Example 1.

First, a thin film of Cu—In—O with a thickness of about 0.2 μm is deposited on a Mo-coated glass substrate, which is similar to that as used in Example 1, by applying laser ablation to a first target of the composition of Cu:In=1.1:0.9. Then, another thin film of Cu—In—O with a thickness of about 0.2 μm is deposited on the already deposited film by applying laser ablation to a second target of the composition of Cu:In=0.9:1.1.

A measurement on the element distribution in the direction of depth of the oxide thin film is made by secondary ion mass spectroscopy (SIMS). From the results of this measurement, it is confirmed that composition of the thin film is in a molar ratio of Cu>In at the side of the substrate and in another molar ratio of Cu<In at the side of the surface.

The two layers of Cu—In—O thin films, whose compositions are different with each other, are subjected to a heat treatment under a $H_2S$ atmosphere similar to that used in Example 1 at 400° C. for 4 hours. The obtained thin films are found to be $CuInS_2$ having a chalcopyrite-type structure by X-ray diffraction analysis. From an observation through a scanning electron microscope on the surface of the thin film, it is found that particle size of $CuInS_2$ is grown much more large, as compared with the sample prepared in Example 1 and shown in FIG. 6.

It is known that when particle size of the chalcopyrite-type compound is large, conversion efficiency of a solar cell which uses the chalcopyrite-type compound is high. In addition to this, if the Group Ib element exists in excess as compared with the Group IIIb element under a condition that the Group VIb element sufficiently exists, another chalcogen compound of the Group Ib element, which is a low resistivity impurity, such as $Cu_{2-x}S$ or $Cu_{2-x}Se$ are produced. The low resistivity impurity gives a detrimental effect on the performance of the solar cell device obtained therefrom. Therefore, the composition in the surface part of the thin film of the chalcopyrite-type compound, which normally forms a junction with the n-type window layer, is desirably in a stoichiometric (Cu:In=1:1) composition or in In-rich composition (Cu<In). Thus, it is appreciated that the thin film has a very desirable characteristics in the point of view of manufacturing the solar cell device, since the thin film of $CuInS_2$ prepared by this Example has a large particle size and the composition in the surface part is in the molar ratio of Cu<In.

EXAMPLE 4

Another thin film of $CuInS_2$ is prepared in the similar manner with that of Example 1, except for a use of $N_2$ gas bubbled in $CS_2$, instead of the mixed gas of $H_2S$ and $N_2$ in the heat treatment.

In this Example, a thin film of $CuInS_2$ of a single phase chalcopyrite-type compound is also obtained as in the cases of Examples 1–3. The analyses on the obtained thin film of the chalcopyrite-type compound, by means of X-ray diffraction, scanning electron microscopy, X-ray microanalyzer and the like, reveal that composition of the film is very uniform, crystal grains are grown sufficiently and adhesivity with the molybdenum layer is preferable.

EXAMPLE 5

Thin films of $CuGaS_2$ and that of $Cu(In_{0.7}Ga_{0.3})S_2$ are respectively prepared in the same manner as that of Example 1, except for a use of a mixture of CuO powder and $Ca_2O_3$ powder in a molar ratio of 2:1, and another mixture of CuO powder, $In_2O_3$ powder and $Ca_2O_3$ powder in a molar ratio of 2:0.7:0.3, as the starting materials for preparing the sintered targets.

Like in Example 1, oxide thin films of Cu—Ga—O and of Cu—In—Ga—O are obtained by using these sintered targets, respectively. When these films are subjected to a heat treatment under a $H_2S$ atmosphere, a thin film of $CuGaS_2$ and that of $Cu(In_{0.7}Ga_{0.3})S_2$ of single phase chalcopyrite-type compounds are obtained, respectively. The analyses on the obtained thin films of the chalcopyrite-type compounds, by means of X-ray diffraction, scanning electron microscopy, X-ray microanalyzer and the like, reveal that compositions of the films are very uniform, crystal grains are grown sufficiently and adhesivities with the molybdenum layers are preferable.

EXAMPLE 6

Thin film of $CuInSe_2$ and that of $CuIn(S_{0.5}Se_{0.5})_2$ are respectively prepared in the same manner as that of Example 1, except for uses of an atmosphere of $H_2Se$ and another atmosphere of a mixed gas of $H_2Se$ and $H_2S$ in the heat treatment of the oxide thin films.

Like in Example 1, when the oxide thin film of Cu—In—O is subjected to a heat treatment under a $H_2Se$ atmosphere, a thin film of $CuInSe_2$ of a single phase chalcopyrite-type compound is obtained. And when another oxide thin film of Cu—In—O is subjected to a heat treatment under a mixed gas atmosphere of $H_2Se$ and $H_2S$, a thin film of $CuIn(S_{0.5}Se_{0.5})_2$ of a single phase chalcopyrite-type compound is obtained. The analyses on the obtained thin films of the chalcopyrite-type compounds, by means of X-ray diffraction, scanning electron microscopy, X-ray microanalyzer and the like, reveal that respective compositions of the films are very uniform, crystal grains are grown sufficiently and adhesivities with the molybdenum layers are preferable.

EXAMPLE 7

Powder of CuO and powder of $In_2O_3$ are wet mixed in a molar ratio of 2:1. The obtained powder mixture is dried and then calcined in the air at 950° C. for 10 hours. The calcined powder is pulverized again, granulated and then press-molded. By baking the molded body in the air at 1000° C. for 10 hours, an intended sintered complex oxide is prepared.

From an analysis on the sintered body by X-ray diffraction, it is found to be $Cu_2In_2O_5$. The X-ray powder diffraction pattern of this sample is shown by FIG. 7.

The sintered body is pulverized and mixed with polyethylene glycol to obtain a paste containing $Cu_2In_2O_5$. This paste is directly printed on a glass substrate by screen process and a film of $Cu_2In_2O_5$ of a thickness of about 10 μm is prepared thereon. This thin film of the complex oxide is subjected to a heat treatment under a $H_2S$ atmosphere (5% of $H_2S+95\%$ of $N_2$) at 600° C. for 4 hours.

From its X-ray diffraction pattern, the obtained thin film of Cu—In—S is found to be a single phase $CuInS_2$ having chalcopyrite-type structure. Further, a composition analysis on the thin film by means of ICP emission spectroscopy has confirmed that molar ratio of Cu:In:S is in 1:1:2. An investigation on two dimensional distribution of respective elements in the obtained thin film by X-ray microanalyzer has found that composition of the $CuInS_2$ thin film is microscopically uniform. As a result of observation through scanning electron microscope on the thin film, it is confirmed that composition of the film is very uniform, and crystal grains are grown sufficiently.

EXAMPLE 8

Powder of CuO and powder of $Ga_2O_3$ are wet mixed in a molar ratio of 2:1. The obtained powder mixture is dried and then, calcined in the air at 950° C. for 10 hours. The calcined powder is pulverized again, granulated and then press-molded. By baking the molded body in the air at 1000° C. for 10 hours, an intended sintered complex oxide is obtained.

Based on the result of the analysis on the sintered body by X-ray diffraction, it is found to be $CuGaO_2$.

The sintered body is pulverized and mixed with polyethylene glycol to obtain a paste containing $CuGaO_2$. This paste is directly printed on a glass substrate by screen process and a film of $CuGaO_2$ with a thickness of about 10 μm is prepared thereon.

This thin film of the complex oxide is subjected to a heat treatment under a $H_2S$ atmosphere (5% of $H_2S+95\%$ of $N_2$) at 600° C. for 4 hours.

From its X-ray diffraction pattern, the obtained thin film of Cu—Ga—S is found to be a single phase $CuGaS_2$ having chalcopyrite-type structure. Further, a composition analysis on the thin film by means of ICP emission spectroscopy confirmed that molar ratio of Cu:Ga:S is in 1:1:2. An investigation on two dimensional distribution of respective elements in the obtained thin film by X-ray microanalyzer has confirmed that composition of the $CuGaS_2$ thin film is microscopically uniform. As a result of the observation through scanning electron microscope on the thin film, it is confirmed that composition of the film is very uniform, and crystal grains are grown sufficiently.

EXAMPLE 9

A glass substrate is used as the substrate. Powder of $Cu_2O$ and powder of $In_2O_3$ are wet mixed in a molar ratio of 1:1. After drying, the obtained powder mixture is mixed with polyethylene glycol to obtain a paste. This paste is directly printed on the glass substrate by screen process and a film with a thickness of about 15 μm is prepared thereon. This film is then subjected to a heat treatment under a $H_2S$ atmosphere (5% of $H_2S+95\%$ of $N_2$) at 600° C. for 4 hours.

Based on its X-ray diffraction pattern, the obtained thin film of Cu—In—S is found to be a single phase $CuInS_2$ having chalcopyrite-type structure. Further, a composition analysis on the thin film by ICP emission spectroscopy confirmed that molar ratio of Cu:In:S is in 1:1:2. An investigation on two dimensional distribution of respective elements in the obtained thin film by X-ray microanalyzer has confirmed that composition of the $CuInS_2$ thin film is microscopically uniform. As a result of observation through scanning electron microscope on the thin film, it is confirmed that composition of the film is very uniform, and crystal grains are grown sufficiently.

Although the present invention has been described in terms of the presently preferred embodiments, it is to be understood that such disclosures is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A method for preparing a Group I/III/VI chalcopyrite compound, which comprises: treating a Group I/III oxide composition, containing at least one of the Group Ib element and at least one of the Group IIIb element, with heat under a reducing atmosphere containing at least one gaseous compound of the Group VIb element or under an atmosphere containing a gaseous reducing compound of at least one of the Group VIb element, thereby converting said oxide composition into a Group I/III/VI chalcopyrite compound.

2. The method according to claim 1, wherein said oxide composition is a complex oxide of at least one of the Group Ib element and at least one of the Group IIIb element.

3. The method according to claim 1, wherein said oxide composition is a mixture of at least one of the oxide of the Group Ib element with at least one of the oxide of the Group IIIb element.

4. The method according to claim 2, wherein said complex oxide is a film deposited on a substrate.

5. The method according to claim 4, wherein said film is obtained by printing a paste containing powder of said complex oxide on said substrate.

6. The method according to claim 5, wherein said complex oxide is obtained by sintering a mixture comprising at least one of the oxide of the Group Ib element and at least one of the oxide of the Group IIIb element.

7. The method according to claim 4, wherein said film is deposited by a physical vapor deposition method.

8. The method according to claim 3, wherein said oxide composition is a film deposited on a substrate.

9. The method according to claim 8, wherein said film is obtained by printing a paste containing powder of said oxide composition mixtures on said substrate.

10. The method according to any of claims 1, 2, 3, 5 or 9, wherein said Group Ib element is Cu, and said Group IIIb element is at least one selected from the group consisting of In and Ga.

11. The method according to any of claims 1, 2, 3, 5 or 9, wherein said reducing compound of the Group VIb element is at least one selected from the group consisting of $H_2S$, $CS_2$ and $H_2Se$.

12. The method according to claim 4 or 8, further comprising, a step of eliminating an oxygen-containing compound by-product in said I/III/VI chalcopyrite compound, performed after said conversion step.

13. The method according to claim 12, wherein said step of eliminating the by-product oxygen-containing compound is a heat treatment under a drying atmosphere at 80° C. or above.

14. The method according to claim 4 or 8, wherein a molar ratio of the Group Ib element to the Group IIIb element in said film is greater at the substrate side, and than at the surface side of the film.

15. The method according to claim 1, wherein said treating with heat is performed at a temperature of 250°–700° C.

16. The method according to claim 1, wherein said treating with heat is performed at a temperature of 400°–600° C.

17. The method according to claim 1, wherein said oxide composition is amorphous.

* * * * *